US006927137B2

(12) United States Patent
Chakravarthi et al.

(10) Patent No.: US 6,927,137 B2
(45) Date of Patent: Aug. 9, 2005

(54) FORMING A RETROGRADE WELL IN A TRANSISTOR TO ENHANCE PERFORMANCE OF THE TRANSISTOR

(75) Inventors: Srinivasan Chakravarthi, Richardson, TX (US); Pr Chidambaram, Richardson, TX (US); Robert C. Bowen, Allen, TX (US); Haowen Bu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/725,977

(22) Filed: Dec. 1, 2003

(65) Prior Publication Data

US 2005/0118792 A1    Jun. 2, 2005

(51) Int. Cl.[7] ............................................. H01L 21/336
(52) U.S. Cl. ...................... 438/289; 438/217; 438/290; 438/291; 438/302; 438/306; 438/528; 438/546; 438/547; 438/910
(58) Field of Search ........................ 438/217, 289–291, 438/302, 306, 528, 546–547

(56) References Cited

U.S. PATENT DOCUMENTS

| 5,681,771 | A | * | 10/1997 | Hwang ........................ 438/291 |
| 5,750,435 | A | * | 5/1998 | Pan ............................. 438/525 |
| 5,972,783 | A | * | 10/1999 | Arai et al. .................... 438/513 |
| 6,162,710 | A | * | 12/2000 | Ito et al. ...................... 438/528 |
| 6,426,279 | B1 | * | 7/2002 | Huster et al. ................ 438/528 |
| 6,603,179 | B2 | * | 8/2003 | Ando et al. .................. 257/369 |
| 6,756,279 | B2 | * | 6/2004 | Menut et al. ................ 438/322 |
| 2001/0016389 | A1 | * | 8/2001 | Wang et al. ................. 438/276 |
| 2002/0031883 | A1 | * | 3/2002 | Sayama ....................... 438/231 |

OTHER PUBLICATIONS

Scott Thompson, "MOS Scaling: Transistor Challenges for the 21st Century—Abstract," Intel Technologies Journal, 3rd Quarter 1998, pp. 1-2, Sep. 1998.
Scott Thompson, "MOS Scaling: Transistor Challenges for the 21st Century—Oxide Scaling,," Intel Technologies Journal, 3rd Quarter 1998, pp. 1-9, Sep. 1998.

(Continued)

Primary Examiner—Mary Wilczewski
Assistant Examiner—Toniae M. Thomas
(74) Attorney, Agent, or Firm—Jacqueline J. Garner; W. James Brady, III; Frederick J. Telecky, Jr.

(57) ABSTRACT

A method of forming a retrograde well in a transistor is provided. A transistor structure having a substrate, a gate, and a gate oxide layer between the substrate and the gate is formed. The substrate includes a channel region located generally below the gate. A first dopant is implanted into the channel region. A second dopant is implanted into the substrate to form a doped source region and a doped drain region. A third dopant is implanted into the gate oxide layer. A source/drain anneal is performed to form a source and a drain in the doped source region and the doped drain region, respectively. The source/drain anneal causes a portion of the first dopant in the channel region to be attracted by the third dopant into the gate oxide layer.

12 Claims, 3 Drawing Sheets

OTHER PUBLICATIONS

Scott Thompson, "MOS Scaling: Transistor Challenges for the 21st Century—Source Drain Engineering," Intel Technologies Journal, 3rd Quarter 1998, pp. 1-10, Sep. 1998.

Scott Thompson, "MOS Scaling: Transistor Challenges for the 21st Century—Channel Engineering," Intel Technologies Journal, 3rd Quarter 1998, pp. 11, Sep. 1998.

Scott Thompson, "MOS Scaling: Transistor Cahllenges for the 21st Century—Circuit and Device Interactions," Intel Technologies Journal, 3rd Quarter 1998, pp. 1-6, Sep. 1998.

Scott Thompson, "MOS Scaling: Transistor Challenges for the 21st Century—Alternate Device Options," Intel Technologies Journal, 3rd Quarter 1998, pp. 1-5, Sep. 1998.

Scott Thompson, "MOS Scaling: Transistor Challenges for the 21st Century—Conclusion," Intel Technologies Journal, 3rd Quarter 1998, pp. 1, Sep. 1998.

* cited by examiner

FORMING A RETROGRADE WELL IN A TRANSISTOR TO ENHANCE PERFORMANCE OF THE TRANSISTOR

TECHNICAL FIELD OF THE INVENTION

This invention relates in general to transistor fabrication, and, more particularly, to forming a retrograde well in a transistor to enhance the performance of the transistor.

BACKGROUND OF THE INVENTION

As semiconductors become more complex and transistors become smaller and smaller, power consumption and heat have become limiting factors to the continued pace of chip design and manufacturing. As millions, or even billions, of smaller and faster transistors get packed on to a single chip the size of a thumbnail, power consumption and the amount of heat generated in the processor core becomes a significant technical challenge. In particular, as chip densities increase, off-state current leakage requires more power and generates more heat, and may present a limit to chip size and integration.

One technique for reducing off-state leakage current is to form a well of dopant in the channel between the source and drain regions of the transistor. For example, in an NMOS device, boron may be implanted into the channel using halo, or pocket, implant methods. Similarly, in a PMOS device, phosphorus may be implanted into the channel using such implant methods. During the source drain anneal, the implanted boron (in an NMOS device) or phosphorus (in a PMOS device) diffuses throughout the channel to form a well having a relatively uniform concentration of boron or phosphorus for some depth below the gate. Such a well affects the resistance of the channel between the source and drain such that off-state leakage current (in other words, leakage current between the source and drain when the transistor is off) is reduced.

SUMMARY OF THE INVENTION

In accordance with the present invention, a method is provided to form a retrograde well in a transistor to enhance the performance of the transistor. For example, the ratio of on-state current to off-state current ($I_{on}/I_{off}$) may be increased for certain types of transistors, including NMOS transistors, for example.

According to one embodiment, a method of forming a retrograde well in a transistor is provided. A transistor structure having a substrate, a gate, and a gate oxide layer between the substrate and the gate is formed. The substrate includes a channel region located generally below the gate. A first dopant is implanted into the channel region. A second dopant is implanted into the substrate to form a doped source region and a doped drain region. A third dopant is implanted into the gate oxide layer. A source/drain anneal is performed to form a source and a drain in the doped source region and the doped drain region, respectively. The source/drain anneal causes a portion of the first dopant in the channel region to be attracted by the third dopant into the gate oxide layer.

According to another embodiment, an integrated circuit including a plurality of transistors is provided. A particular one of the transistors includes a substrate, a gate, and a gate oxide layer between the substrate and the gate. The substrate includes a channel region located generally below the gate. The channel region includes a retrograde well having been formed at least by: implanting a first dopant into the channel region; implanting a second dopant into the substrate to form a doped source region and a doped drain region; implanting a third dopant into the gate oxide layer; and performing a source/drain anneal to form a source and a drain in the doped source region and the doped drain region, respectively. The source/drain anneal causes a portion of the first dopant in the channel region to be attracted by the third dopant into the gate oxide layer such that the concentration of the third dopant in the channel region increases from a first region adjacent the gate oxide layer to a second region further from the gate oxide.

According to yet another embodiment, an integrated circuit including a plurality of transistors is provided. A particular one of the transistors includes a substrate, a gate, and a gate oxide layer between the substrate and the gate. The substrate includes a channel region located generally below the gate. The channel region includes a retrograde well of boron dopant.

Various embodiments of the present invention may benefit from numerous advantages. It should be noted that one or more embodiments may benefit from some, none, or all of the advantages discussed below.

One advantage is that in one embodiment, a retrograde well of boron is formed in the channel region of an NMOS transistor by implanting hydrogen into the gate dielectric layer which attracts boron into the gate dielectric layer during the source/drain anneal. By lowering the concentration of boron near the substrate/dielectric layer interface, the resistance proximate the interface is reduced, and thus the on-state current is increased. The concentration of boron further from the interface is substantially unaffected, and thus the off-state leakage current is substantially unaffected. As a result, the ratio $I_{on}/I_{off}$ is increased, which increases the efficiency and performance of transistor.

Another advantage is that a nitride cap may be formed over the transistor structure to reduce or eliminate the implanted hydrogen from escaping from the gate and/or gate dielectric layer, which in turn increases the amount of boron attracted into the gate dielectric layer during the source/drain anneal.

Other advantages will be readily apparent to one having ordinary skill in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Example embodiments of the present invention and their advantages are best understood by referring now to FIGS. 1 through 4D of the drawings, in which like numerals refer to like parts.

Among other things, various embodiments of the present invention are directed toward introducing hydrogen or other dopants into a transistor gate oxide to enhance the performance of the transistor.

Figure 1:
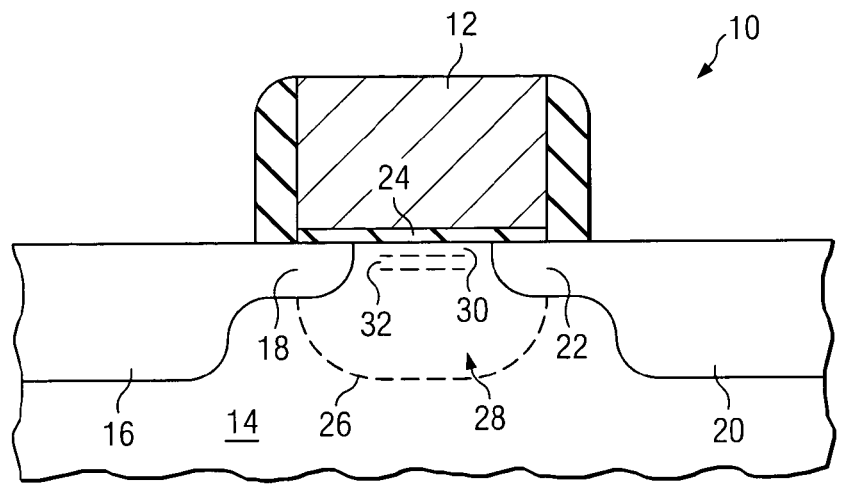
FIG. 1 illustrates an example transistor having a retrograde doped well in accordance with one embodiment of the present invention.

FIG. 1 illustrates an example transistor 10 in accordance with one embodiment of the present invention. In this embodiment, transistor 10 is an NMOS transistor. Transistor 10 includes a gate 12 formed adjacent and a substrate 14. An active source 16, a source extension 18, an active drain 20, and a drain extension 22 are formed in substrate 14. Substrate 14 may be formed from silicon, gallium arsenide, or any other material suitable to form a transistor substrate.

A gate dielectric, or gate oxide, layer 24 is formed at the junction between gate 12 and substrate 14. In some embodiments, dielectric layer 24 may also extend over source region 12 and/or drain region 14. As an example, in an embodiment in which substrate 14 comprises silicon, dielectric layer 24 comprises silicon dioxide ($SiO_2$).

Source 16, source extension 18, drain 20, and drain extension 22 are formed by implanting one or more dopants into appropriate regions of substrate 14 using any suitable known doping method.

Gate 12 is formed adjacent substrate 14 between source and drain regions 12 and 14. It should be noted that the term "adjacent" as used throughout this document includes immediately adjacent (or contacting), as well as proximate to. Thus, for example, as shown in FIG. 1, gate 12 may be adjacent to substrate 14 with a thin dielectric layer 24 disposed between gate 12 and substrate 14, as discussed below.

Gate 12 may comprise one or more conductive materials suitable for use as a transistor gate, such as titanium, titanium nitride, tungsten, polysilicon, or amorphous silicon. In some embodiments, gate 12 is formed by implanting one or more dopants into a gate poly region using any suitable known doping method. Source 16, source extension 18, drain 20, drain extension 22, and gate 12 may be doped using one or more of the same or different doping processes.

The region of substrate 14 located below gate 12 and generally between source 16 and drain 20 may be referred to as a channel region 26. Channel region 26 is referred to throughout this document as being "below" gate 12. Although the term "below" refers to the orientation of transistor 10 shown in FIG. 1, it should be understood that according to the physical relationship between channel region 26 and gate 12 shown in FIG. 1, channel region 26 may be said to be "below" gate 12 regardless of the orientation of transistor 10.

A well, or pocket, 28, shown generally by the dotted line in FIG. 1, is formed in channel region 26. In one embodiment, well 28 is formed by doping channel region 26 with boron using one or more halo implants, doping dielectric layer 24 with hydrogen, and performing a source/drain anneal. During the source/drain anneal, the boron dopant within channel region 26 diffuses to form well 28, defined generally by the dotted line in FIG. 1. As the boron diffuses, a portion of the boron proximate dielectric layer 24 is attracted into dielectric layer 24 by the hydrogen dopant within dielectric layer 24. As a result, in a region of well 28 proximate dielectric layer 24, the concentration of boron decreases in the direction approaching dielectric layer 24. In other words, as shown in FIG. 1, the average concentration of boron within a first region 30 of well 28 proximate dielectric layer 24 (i.e., the region between the upper dotted line and the interface between substrate 14 and dielectric layer 24) is lower than the average concentration of boron within a second region 32 of well 28 further from dielectric layer 24 (i.e., the region between the upper dotted line and the lower dotted line). Since the concentration of dopant increases with increasing depth below dielectric layer 24 (at least for some distance), well 28 may be referred to as a "retrograde" well or pocket.

Figure 2:
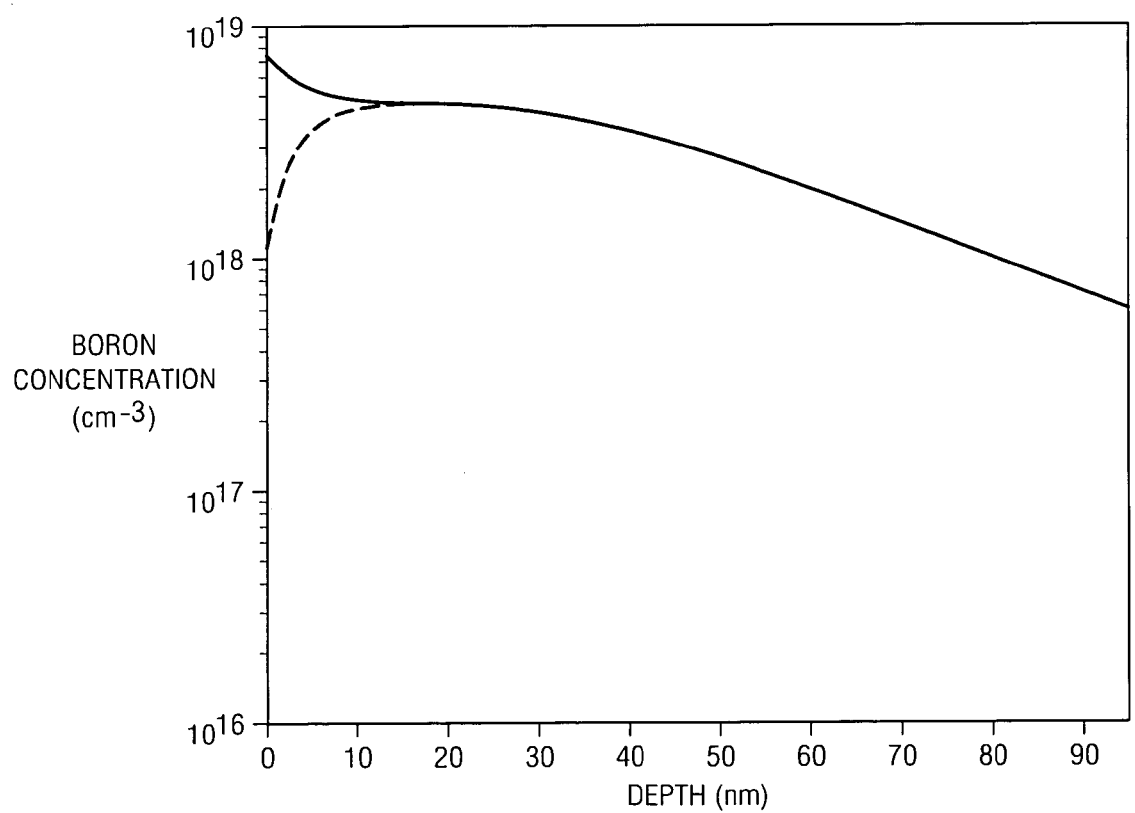
FIG. 2 is a graph illustrating boron concentration as a function of depth for a well according to an embodiment of the invention and for a well formed according to conventional methods.

FIG. 2 is a graph illustrating boron concentration as a function of depth below dielectric layer 24 (through substrate 14) for (1) a well 28 formed as described above (i.e., with hydrogen being implanted in dielectric layer 24 before the source/drain anneal), shown as curve 34; and (2) a well formed in a similar manner, but without implanting hydrogen into dielectric layer 24 before the source/drain anneal, shown as curve 36.

As shown by line 34, the concentration of boron within well 28 (formed after the hydrogen implant) decreases sharply as the interface between substrate 14 and dielectric layer 24 is approached. This is a result of a portion of the boron dopant proximate dielectric layer 24 being attracted by hydrogen within dielectric layer 24 and thus diffusing into dielectric layer 24 during the source/drain anneal.

In contrast, as shown by line 36, the concentration of boron within a well formed in a similar manner, but without the hydrogen implant into dielectric layer 24, increases (moving toward dielectric layer 24) for at least a portion of the range of depth in which the concentration of boron within well 28 (shown by line 34) decreases.

Generally, a boron-doped well or pocket is formed in the channel region of a transistor in order to increase resistance and thus reduce leakage current between the source and drain when the transistor is off, which may be referred to as off-state leakage current, $I_{off}$. However, the increased resistance caused by the boron within the channel region also reduces the on-state current, $I_{on}$, which is typically undesirable, as the on-state current and speed of the transistor are directly related. Thus, it is typically desirable to increase or maximize the ratio of on-state leakage current to off-state current, or $I_{on}/I_{off}$.

As known in the art, on-state current generally runs closer to the interface between the substrate and gate dielectric layer than the off-state leakage current. Thus, by lowering the concentration of boron very near the interface as described herein, the resistance proximate the interface is reduced, and thus the on-state current is increased. The concentration of boron further from the interface is substantially unaffected, and thus the off-state leakage current is substantially unaffected. As a result, the ratio $I_{on}/I_{off}$ is increased, which increases the efficiency and performance of transistor 10.

Figure 3:
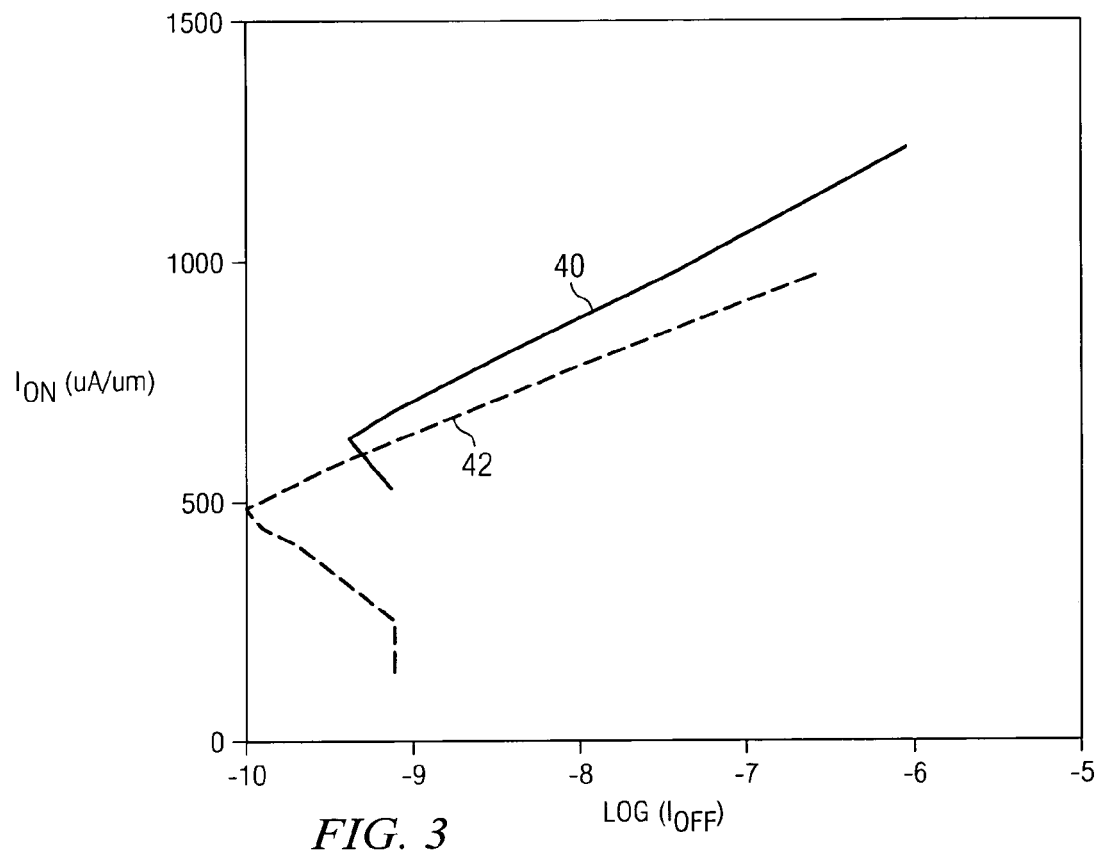
FIG. 3 illustrates the ratio of on-state leakage current to off-state current, $I_{on}/I_{off}$, for a transistor formed according to an embodiment of the invention and for a transistor formed according to conventional methods.

FIG. 3 illustrates the ratio of on-state leakage current to off-state current, $I_{on}/I_{off}$, for transistor 10 formed using the process discussed herein (i.e., with the hydrogen implant), shown by curve 40, and a transistor formed using a traditional process (i.e., without the hydrogen implant), shown by curve 42. As shown in FIG. 3, the $I_{on}/I_{off}$ ratio is greater for transistor 10 formed as discussed herein.

Figure 4A:
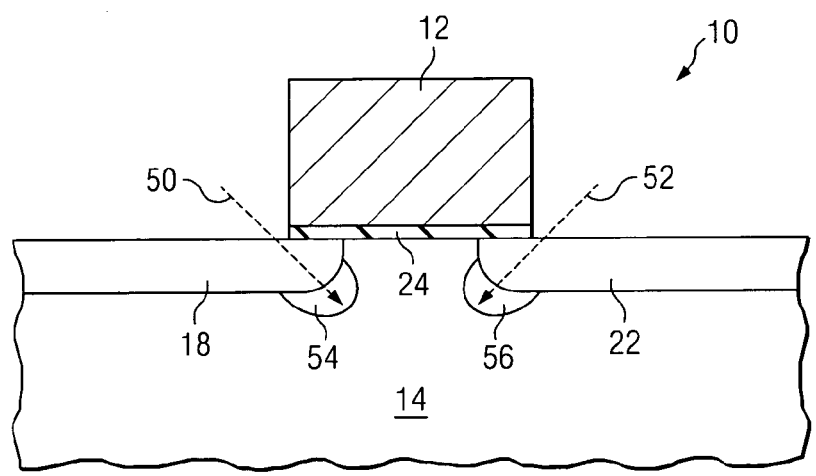
FIGS. 4A through 4D illustrate a method of forming the transistor of FIG. 1 in accordance with an embodiment of the invention.

FIGS. 4A through 4D illustrate a method of forming a transistor 10 having a retrograde well 28 in accordance with an embodiment of the invention. As shown in FIG. 4A, a transistor structure includes gate 12 formed adjacent substrate 14. Dielectric layer 24 is formed due to oxidation between gate 12 and substrate 14. Source extension 18 and drain extension 22 are formed in substrate 14 by implanting one or more dopants into appropriate regions of substrate 14 using any suitable known doping method. For example, in one embodiment, arsenic is implanted into substrate 14 to form source extension 18 and drain extension 22. Boron dopant is implanted into channel region 26 of substrate 14 by performing a halo, or pocket, implant on each side of gate 12, indicated by arrows 50 and 52. The boron halo implants are shown in FIG. 4A as implants 54 and 56.

Figure 4B:
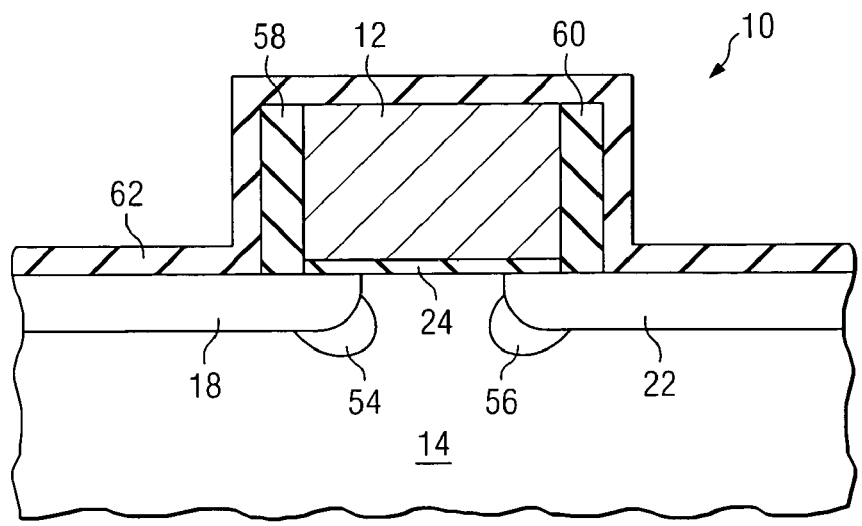

As shown in FIG. 4B, spacers 58 and 60 may be formed on each side of gate 18, such as by depositing oxide, nitride or a combination thereof, and performing a vertical etch. Spacers 58 and 60 are formed to control the location of the source 16 and drain 20 subsequently formed on each side of gate 12. In some embodiment, spacers 58 and 60 are not used.

A layer of nitride may then be deposited over the transistor structure to form a nitride cap 62. Nitride cap 62 reduces or eliminates the subsequently implanted hydrogen from escaping from dielectric layer 24 and/or gate 12 during the source/drain anneal, as discussed below with reference to FIG. 4D. In some embodiments, a nitride cap is not formed.

Figure 4C:
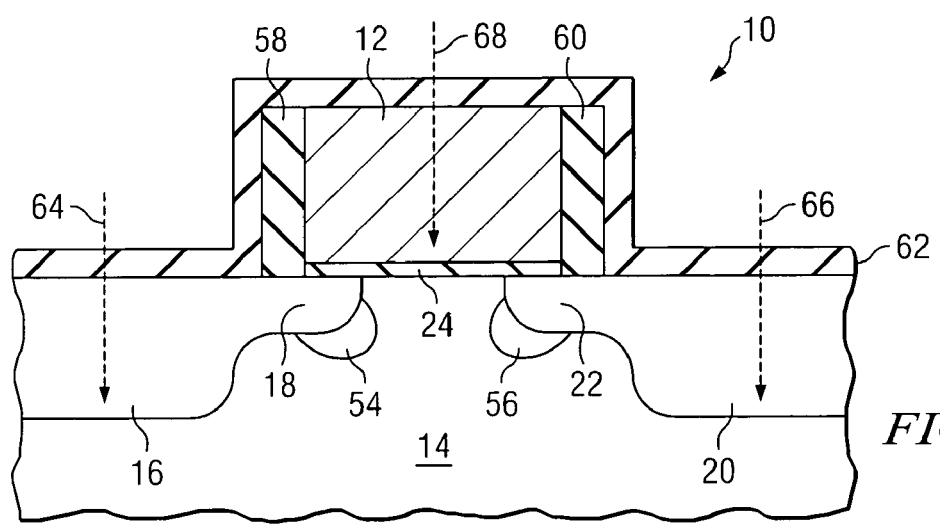

As shown in FIG. 4C, source 16 and drain 20 are formed in substrate 14 by implanting one or more dopants into appropriate regions of substrate 14 on each side of gate 12 using any suitable known doping method, as indicated by arrows 64 and 66. For example, in one embodiment, arsenic is implanted into substrate 14 to form source 16 and drain 20.

In addition, hydrogen is implanted into gate 12 and dielectric layer 24, such as using a well-known proton implant, as indicated by arrow 68. In some embodiments, the hydrogen implant is performed simultaneously with the source and drain implants. In other embodiments, the hydrogen implant is performed partially simultaneously with the source and drain implants such that the processes partially overlap. In still other embodiments, the hydrogen implant is performed separately from the source and drain implants. In some embodiments, the hydrogen implant may be performed at any time before an annealing process is performed which diffuses the boron halo implants 54 and 56.

Figure 4D:
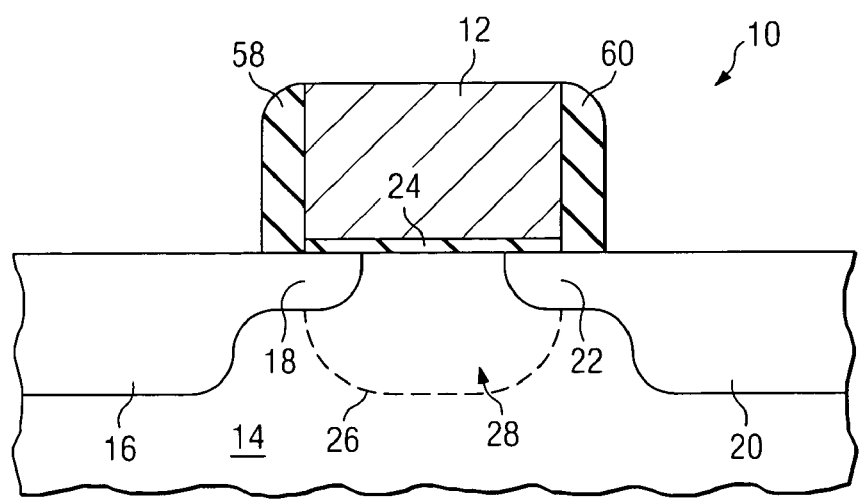

As shown in FIG. 4D, a source/drain annealing process is performed to activate the dopant in source 16 and drain 20. The source/drain anneal causes the boron within dopant implants 54 and 56 to diffuse through channel region 26 to form well 28, defined generally by the dotted line in FIG. 4D. As discussed above with respect to FIG. 1, a portion of the boron proximate dielectric layer 24 is attracted into dielectric layer 24 by the hydrogen dopant within dielectric layer 24. As a result, the concentration of boron increases through some depth of substrate 14 moving away from the interface between dielectric layer 24 and substrate 14 (i.e., moving downward in the orientation shown in FIG. 4D). Thus, since the concentration of dopant increases with increasing depth below dielectric layer 24 (at least for some distance), well 28 may be referred to as a "retrograde" well or pocket.

In alternative embodiments, one or more other dopants may be used instead of boron and hydrogen. For example, deuterium or phosphine (PH$_3$) may be used instead of boron for the halo implants shown in FIG. 4A. The deuterium or phosphine (PH$_3$) will similarly be attracted toward hydrogen implanted in dielectric layer 24.

Although embodiments of the invention and its advantages have been described in detail, a person skilled in the art could make various alterations, additions, and omissions without departing from the spirit and scope of the present invention as defined by the appended claims.

What is claimed is:

1. A method of forming a retrograde well in a transistor, comprising:
    forming a transistor structure having a substrate, a gate, and a gate oxide layer between the substrate and the gate, the substrate including a channel region located generally below the gate;
    implanting a first dopant into the channel region;
    implanting a second dopant into the substrate to form a doped source region and a doped drain region;
    implanting a third dopant into the gate oxide layer;
    performing a source/drain anneal to form a source and a drain in the doped source region and the doped drain region, respectively, the source/drain anneal causing a portion of the first dopant in the channel region to be attracted by the third dopant into the gate oxide layer.

2. The method of claim 1, wherein the transistor structure is an NMOS transistor structure.

3. The method of claim 1, wherein implanting a first dopant into the channel region comprises implanting a first dopant using at least one halo implant.

4. The method of claim 3, wherein the first dopant comprises boron.

5. The method of claim 4, wherein the first dopant comprises boron and the third dopant comprises hydrogen.

6. The method of claim 1, wherein the third dopant comprises hydrogen.

7. The method of claim 1, wherein the third dopant comprises deuterium.

8. The method of claim 1, wherein the third dopant comprises phosphine (PH$_3$).

9. The method of claim 1, wherein implanting a third dopant into the gate oxide layer comprises implanting a third dopant into the gate such that a portion of the third dopant is communicated into the gate oxide layer.

10. The method of claim 1, wherein the steps of implanting the second dopant and implanting the third dopant are performed at least partially simultaneously.

11. The method of claim 1, further comprising forming a cap over the gate before performing the source/drain anneal such that the cap at least partially prevents the third dopant from escaping during the source/drain anneal.

12. The method of claim 11, wherein the cap comprise nitride.

* * * * *